(12) United States Patent
Lee

(10) Patent No.: US 6,278,636 B1
(45) Date of Patent: Aug. 21, 2001

(54) NONVOLATILE SEMICONDUCTOR MEMORY DEVICE HAVING IMPROVED PAGE BUFFERS

(75) Inventor: Jin-Yub Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/521,168

(22) Filed: Mar. 8, 2000

(30) Foreign Application Priority Data

Mar. 8, 1999 (KR) .................................................. 99-07570

(51) Int. Cl.$^7$ ........................................................ G11C 7/00
(52) U.S. Cl. .............................. 365/189.05; 365/189.01; 365/204; 365/189.11
(58) Field of Search ......................... 365/189.01, 189.02, 365/189.05, 204, 222, 189.11

(56) References Cited

U.S. PATENT DOCUMENTS

| 5,541,879 | * | 7/1996 | Suh et al. .......................... 365/185.22 |
| 5,708,622 | * | 1/1998 | Ohtani et al. ......................... 365/233 |
| 5,748,535 | * | 5/1998 | Lin et al. ........................... 365/185.22 |
| 5,835,414 | * | 11/1998 | Hung et al. . |
| 5,954,828 | * | 9/1999 | Lin ......................................... 714/630 |
| 5,963,475 | * | 10/1999 | Choi et al. ........................ 365/185.11 |
| 5,999,451 | * | 12/1999 | Lin et al. .......................... 365/185.11 |
| 6,021,069 | * | 2/2000 | Hung et al. ....................... 365/185.22 |

* cited by examiner

Primary Examiner—Viet Q. Nguyen
(74) Attorney, Agent, or Firm—Marger Johnson & McCollom, P.C.

(57) ABSTRACT

Disclosed herein is a nonvolatile semiconductor memory device which comprises a memory cell array, page buffers and Y-pass gate circuit. Each page buffer according to the present invention contains its latch which has a first current driving capacity during a sensing period of a read operation and a second current driving capacity during a data output period of the read operation. Similar adjustable current drive capacity is provided during a program operation of the memory device. Preferably, such additional current drive capacity is provided via dual parallel pull-up transistors provided within a data latch circuit corresponding with each bit line of the memory device. Provision of the second parallel transistor and associated gating eliminates the need for one of the prior art circuit inverters in the latch, thereby reducing layout space over-all within the page buffer circuit region of the device.

13 Claims, 5 Drawing Sheets

NONVOLATILE SEMICONDUCTOR MEMORY DEVICE HAVING IMPROVED PAGE BUFFERS

FIELD OF THE INVENTION

The present invention relates to memories and more particularly to memories employing electrically erasable and programmable read-only-memory cells (EEPROM cells).

BACKGROUND OF THE INVENTION

There is an increasing demand for semiconductor memories that can be electrically erased and programmed without the need for refreshing data stored in the memory. Also, there is a trend toward enhancing the storage capacity and the density of integration in memory devices. NAND-type flash memory is one example of a nonvolatile semiconductor memory that provides high capacity and integration density without the need for refreshing stored data.

FIG. 1 contains a block diagram of an array of memory cells and conventional page buffers assigned to the array in a NAND-type flash memory. The memory includes a memory cell array 10, a page buffer circuit 20 and a Y-pass gate circuit 30 (or referred to as "a switch circuit"). The memory cell array 10 is formed of a plurality of strings 12 (a "string" is a cell unit corresponding to one bit of data) arranged in columns. Each string 12 includes a string selection transistor SSTi (i=0, 1, . . . , m), the gate of which is coupled to a string selection line SSL. Each string 12 also includes a ground selection transistor GSTi (i=0, 1, . . . , m), the gate of which is coupled to a ground selection line GSL. Memory cells MCj (j=0, 1, . . . , n) are connected in series between each string selection transistor SSTi and its associated ground selection transistor GSTi. Control gates of the memory cells are coupled to word lines WLj (j=0, 1, . . . , n). The drain of each string selection transistor SSTi is connected to its corresponding bit line BLi (i=0, 1, . . . , m), and the source of each ground selection transistor GSTi is connected to a common source line CSL.

The page buffer circuit 20 includes page buffers 20_i (i=0, 1, . . . , m) corresponding to the bit lines BLi, respectively. During a read operation, a page buffer senses data from a selected memory cell and then transfers the data to a data bus DB through the Y-pass gate circuit 30. Hereinafter, even page buffer 20_0, corresponding to bit line BL0, is referred to in describing its constructions. Other page buffers 20_1 to 20_m, corresponding to other bit lines BL1 to BLm, have the same constructions and functions as those of the page buffer 20_0.

The page buffer 20_0 includes PMOS transistor M2, six NMOS transistors M1 and M3 to M7, a latch 40 formed of a pair of inverters INV1 and INV2, and tri-state inverter INV3. The NMOS transistor M1, whose gate is coupled to signal BLSHF, is connected between a sensing node N1 and a corresponding bit line BL0 to adjust a voltage level of the bit line BL0 which is developed while being activated and to prevent the page buffer 20_0 from being influenced by a high voltage when the high voltage is applied to BL0. The gate and source of the PMOS transistor M2, the drain of which is connected to the sensing node N1 (at the drain of M1), are connected to a signal CURMIR and a power supply voltage Vcc, respectively. The PMOS transistor M2 supplies current to the bit line BL0 in response to the signal CURMIR.

As seen from FIG. 2, the inverter INV1 of the latch 40 is formed of two PMOS transistors M12 and M13 and one NMOS transistor M14 connected as illustrated in FIG. 2, and the inverter INV2 of the latch 40 is formed of CMOS inverter well known in the art. The PMOS transistor M12 is controlled by a signal PBset, which from FIG. 1 will be understood to be inactivated only when the NMOS transistor M3 is turned on (i.e. only during a discharge period of the read operation when DCB is active (high)). This is to prevent power noise from being generated when the page buffers are reset and the bit lines are discharged.

Referring again to FIG. 1, the NMOS transistor M3 has its source and gate connected to a ground voltage Vss and a signal DCB, respectively, and is connected between the sensing node N1 and the ground voltage Vss. The transistor M3 discharges a voltage of the bit line BL0 and resets the page buffer 20_0 output to a ground level. The NMOS transistor M4, the gate of which is coupled to a signal SBL, is connected between a node N2 of latch 40 and the sensing node N1. The drain of the transistor M4 is connected to the Y-pass gate circuit 30 through tri-state inverter INV3, the state of which is controlled by signals Osac and nOsac (the complement of Osac). Data in the latch 40 is transferred to the data bus DB through the tri-state inverter INV3 and the Y-pass gate circuit 30. Data to be programmed is transferred to the node N2 of the latch 40 through the NMOS transistor M7, the gate of which is coupled to a signal SPB. Node N3 (a complementary node of N2) of latch 40 is connected to Vss through the NMOS transistor M5, whose gate is coupled to the sensing node N1, and the NMOS transistor M6, whose gate is coupled to a signal Olatch. The NMOS transistors M5 and M6 thus set the state of data stored in the latch in response to a voltage level on the bit line BL0.

According to the conventional page buffer as described above, when data held in the latch 40 is transferred to the data bus DB during read and program operation, the tri-state inverter INV3 not only drives the data bus DB in response to a voltage level of the node N2, but also prevents charges on the node N2 from being discharged to the data bus DB. However, the data path of the conventional page buffer is divided into an input path formed of the NMOS transistor M7 and an output path formed of the tri-state inverter INV3. And, the tri-state inverter INV3 is formed by use of multiple MOS transistors and power lines as well known to ones skilled in the art. For this reason, the conventional page buffer has a high component count that renders it difficult to lay out the tri-state inverters in the page buffers 20_i within a page buffer region of the flash memory device in which higher capacity and integration density are required.

SUMMARY OF THE INVENTION

It is therefore an object of the present invention to provide a nonvolatile semiconductor memory device having improved page buffers.

In order to attain the above objects, according to an aspect of the present invention, there is provided a nonvolatile semiconductor memory device which contains memory cells arranged in rows and columns, page buffers and Y-pass gate circuit. The page buffers are arranged so as to correspond to the columns, with each page buffer holding a datum. The Y-pass gate circuit selects one or more of the bit lines to transfer data held in latches corresponding to the selected bit lines to a data bus. Each latch has adjustable current driving capacity: a first current driving capacity when data is sensed and latched by corresponding page buffers during a read operation, and a second current driving capacity when data is transferred from the corresponding page buffers to the data bus via the switch circuit during the read operation.

In accordance with one embodiment, the latch of each page buffer comprises an inverter having an input terminal coupled to a corresponding sensing node via the first transfer transistor and an output terminal coupled to a latch controller; a first pull-up transistor having a source coupled to a power supply voltage, a gate coupled to a first control signal, and a drain; a second pull-up transistor having a source coupled to the power supply voltage, a gate coupled to a second control signal, and a drain coupled to the drain of the first pull-up transistor; a third pull-up transistor having a source coupled to a common drain of the first and second pull-up transistors, a gate coupled to the input terminal of the inverter, and a drain coupled to the output terminal of the inverter; and a pull-down transistor having a drain coupled to the input terminal of the inverter, a gate coupled to the output terminal of the inverter, and a source grounded.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

The preferred embodiment according to the present invention will be more fully described below with reference to the accompanying drawings.

Figure 3:
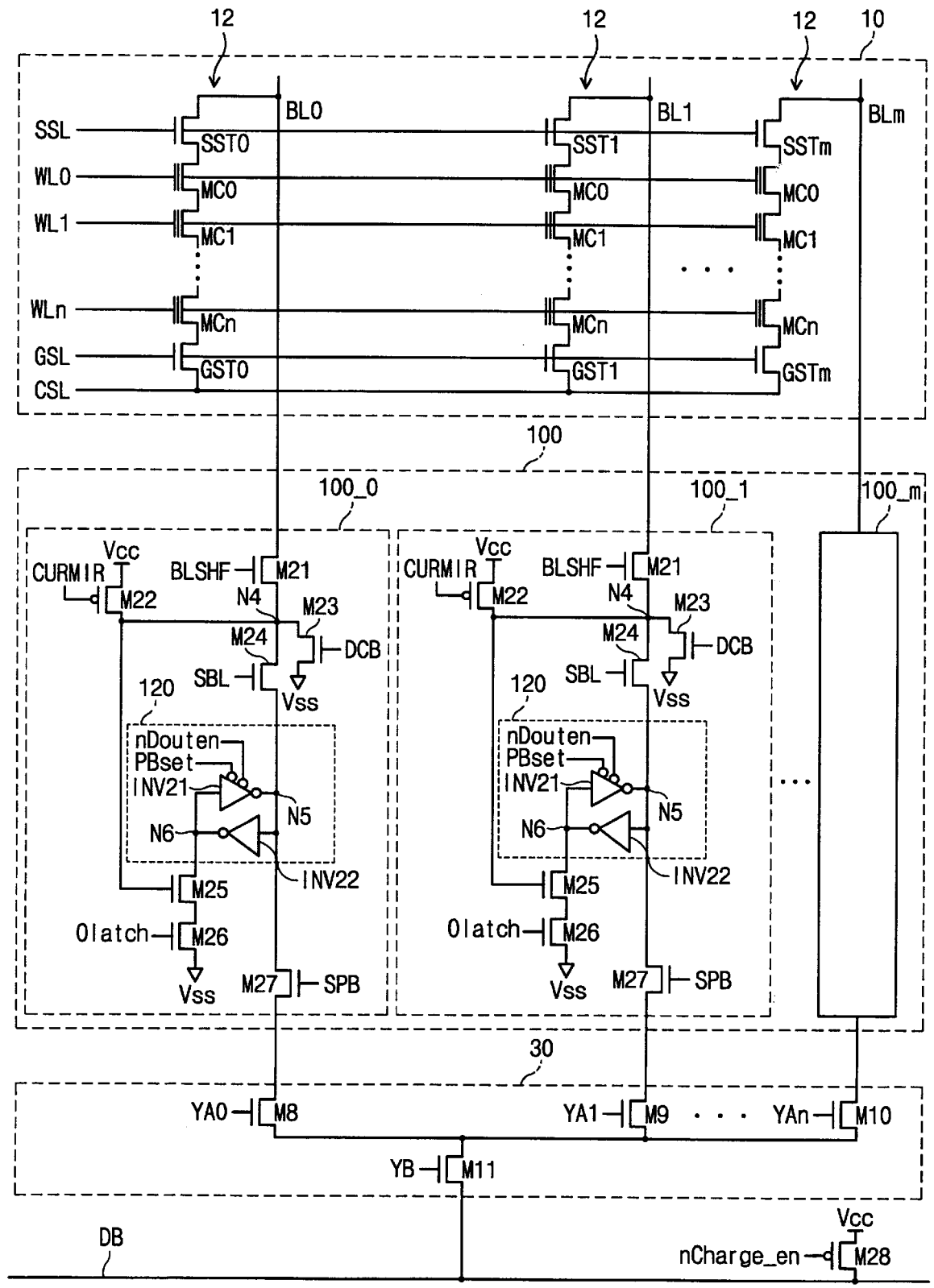
FIG. 3 is a block diagram of a memory cell array and page buffers in a NAND-type flash memory device according to the present invention.

FIG. 3 contains a block diagram of an array of memory cells and page buffers assigned to the array in a NAND-type flash memory according to the present invention. The memory includes a memory cell array 10, a page buffer circuit 100 and a Y-pass gate circuit 30 (referred to also as "a switch circuit"). The memory cell array 10 is formed of a plurality of strings 12 (a "string" is a cell unit corresponding to one bit of data) arranged in columns. Each string 12 includes a string selection transistor SSTi (i=0, 1, . . . , m), the gate of which is coupled to a string selection line SSL. Each string 12 also includes a ground selection transistor GSTi (I=0, 1, . . . , m), the gate of which is coupled to a ground selection line GSL. Memory cells MCj (j=0, 1, . . . , n) are connected in series between each string selection transistor SSTi and its associated ground selection transistor GSTi. Control gates of the memory cells MCj are coupled to corresponding word lines WLj (j=0, 1, . . . , n). The drain of each string selection transistor SSTi is connected to its corresponding bit line Bli (i=0, 1, . . . ,m), and the source of each ground selection transistor GSTi is connected to a common source line CSL. The word lines WLj, the string selection line SSL and the ground selection line GSL are coupled to a row decoder (not shown).

The page buffer circuit 100 according to the present invention includes a plurality of page buffers 100_i assigned to the bit lines BLi in the memory cell array 10.

Figure 1:
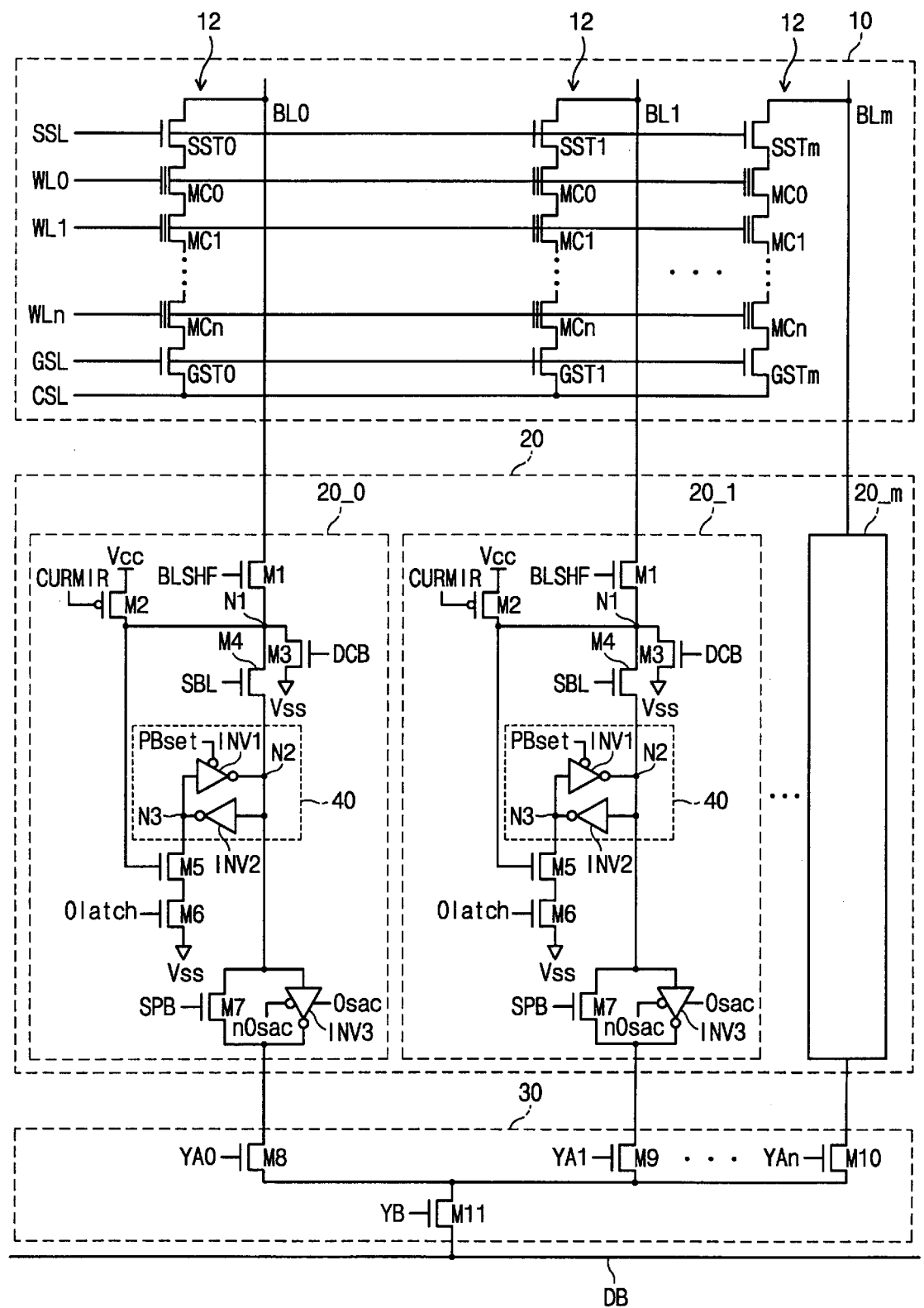
FIG. 1 is a block diagram of a memory cell array and page buffers in a conventional NAND-type flash memory device.

One page buffer 100_0, corresponding to a bit line BL0, is referred to in describing its construction. Other page buffers 100_1 to 100_m, corresponding to other bit lines BL1 to BLm, have the same constructions and functions as those of the page buffer 100_0. The page buffer 100_0 includes PMOS transistor M22, six NMOS transistors M21 and M23 to M27 and a latch 120 formed of a pair of inverters INV21 and INV22. In this embodiment, the page buffer 100_0 according to the present invention differs from that of FIG. 1 in that the tri-state inverter INV3 of FIG. 1 is removed and one inverter INV1 of FIG. 1 is substituted by an inverter INV21 which performs the function similar to the removed tri-state inverter INV3, as will be more fully described below.

Referring to FIG. 3, the NMOS transistor M21 (referred to as "a bit line shut-off transistor"), whose gate is coupled to a signal BLSHF, is connected between a sensing node N1 and a corresponding bit line BL0 to adjust a voltage level of the bit line BL0 which is developed while being activated and to prevent the page buffer 100_0 from being influenced by a high voltage when the high voltage is applied to the bit line BL0. The gate and source of the PMOS transistor M22, the drain of which is connected to the sensing node N4 (and to the drain of M21), are connected to a signal CURMIR and a power supply voltage Vcc, respectively. The PMOS transistor M22 supplies current to the bit line BL0 in response to the signal CURMIR.

Continuously, the NMOS transistor M23 (referred to as "a discharge transistor") has its source and gate connected to a ground voltage Vss and a signal DCB, respectively, and its drain is connected to the sensing node N4. The NMOS transistor M23 discharges a voltage of the bit line BL0 and resets the latch 120 to a ground voltage Vss level (i.e. it sets a node N5 to the ground voltage level). The NMOS transistor M24 (referred to as "a first transfer transistor"), the gate of which is coupled to a signal SBL, is connected between the nodes N4 and N5. The drain of the transistor M24 is connected to the Y-pass gate circuit 30 via the NMOS transistor M27 (referred to as "a second transfer transistor"), the gate of which is coupled to a signal SPB. Data to be programmed is transferred to the node N5 of the latch 120 through the NMOS transistor M27. Furthermore, data held in the latch 120 is transferred to the Y-pass gate circuit 30 via the NMOS transistor M27. A node N6 (a complementary node of N5) of the latch 120 is connected to Vss through the NMOS transistor M25, whose gate is coupled to the sensing node N4, and the NMOS transistor M26, whose gate is coupled to a signal Olatch. The NMOS transistors M25 and M26 change a state of data stored in the latch in response to a voltage level on the bit line BL0, and constitute "a latch controller".

As illustrated in FIG. 3, the NAND-type flash memory device further comprises precharge means formed of PMOS transistor M28. The precharge means is connected to the data bus DB, and is to charge the data bus DB at a power supply voltage Vcc before a selected memory cell starts to be programmed, as will be more fully described below.

Figure 4:
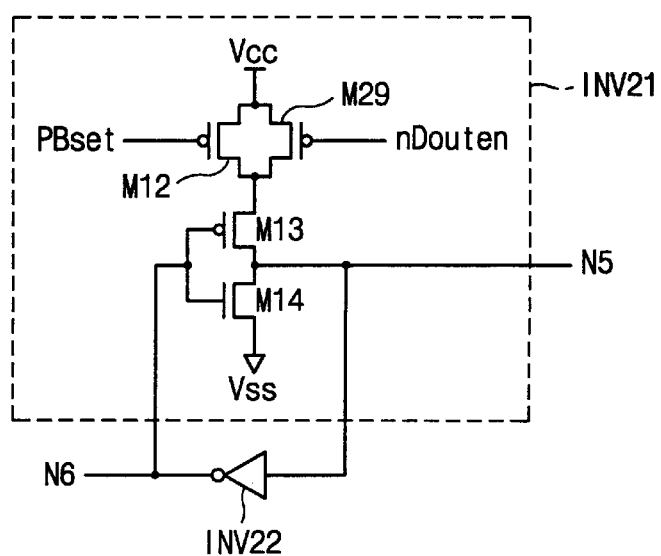
FIG. 4 shows a preferred embodiment of a latch illustrated in FIG. 3.

Referring to FIG. 4, a preferred embodiment of the latch 120 of FIG. 3 is illustrated. One inverter INV21 of the latch 120 is formed of three PMOS transistors M12, M13 and M29 used as pull-up transistors, and an NMOS transistor M14 used as a pull-down transistor. (The other inverter INV22 is a well-known CMOS inverter.) The PMOS transistor M12 has its source connected to the power supply voltage Vcc and its gate coupled to a signal PBset. The PMOS transistor M13, whose source is connected to the drain of the transistor M12, has its gate coupled to the node N6 and its drain coupled to the node N5. The PMOS transistor M29, the gate of which is connected to a signal nDouten, has its source coupled to the power supply voltage Vcc and its drain coupled in common to the drain of the transistor M12 and the source of the transistor M13. The NMOS transistor M14 has its gate coupled to the node N6, its drain coupled in common to the node N5 and to the drain of the transistor M13, and its source coupled to the ground voltage Vss.

When the low-active signal nDouten is high (inactivated), the current driving capacity of the latch 120 is determined only by the PMOS transistor M12 (hereinafter, it is referred to as "a first current driving capacity"). On the other hand, when the signal nDouten is activated low, the current driving capacity of the latch 120 is determined by the PMOS transistors M12 and M29 (hereinafter, it is referred to as "a second current driving capacity"). Thus, according to the improved page buffer of the present invention, the latch 120 has adjustable current driving capacity.

In this embodiment, the PMOS transistor M12 is controlled by the signal PBset, which is inactivated any time the NMOS transistor M23 is turned on, i.e. only during a discharge period of the read operation. This is to prevent power noise from being generated when the page buffers 100_i are reset and the bit lines are discharged. Furthermore, the signal nDouten is activated when data in the latch 120 is transferred to the data bus DB via the Y-pass gate circuit 30. This is to prevent charges on the node N5 from being discharged to the data bus DB. Furthermore, the signal nDouten is activated when data in the latch 120 is transferred to the corresponding bit line BL0 during a program operation (or the bit line BL0 is charged by the latch 120, depending on its latch state during the program operation). This is to charge the bit line BL0 at Vcc a shorter period of time during a bit line charge period of the program operation.

Figure 5:
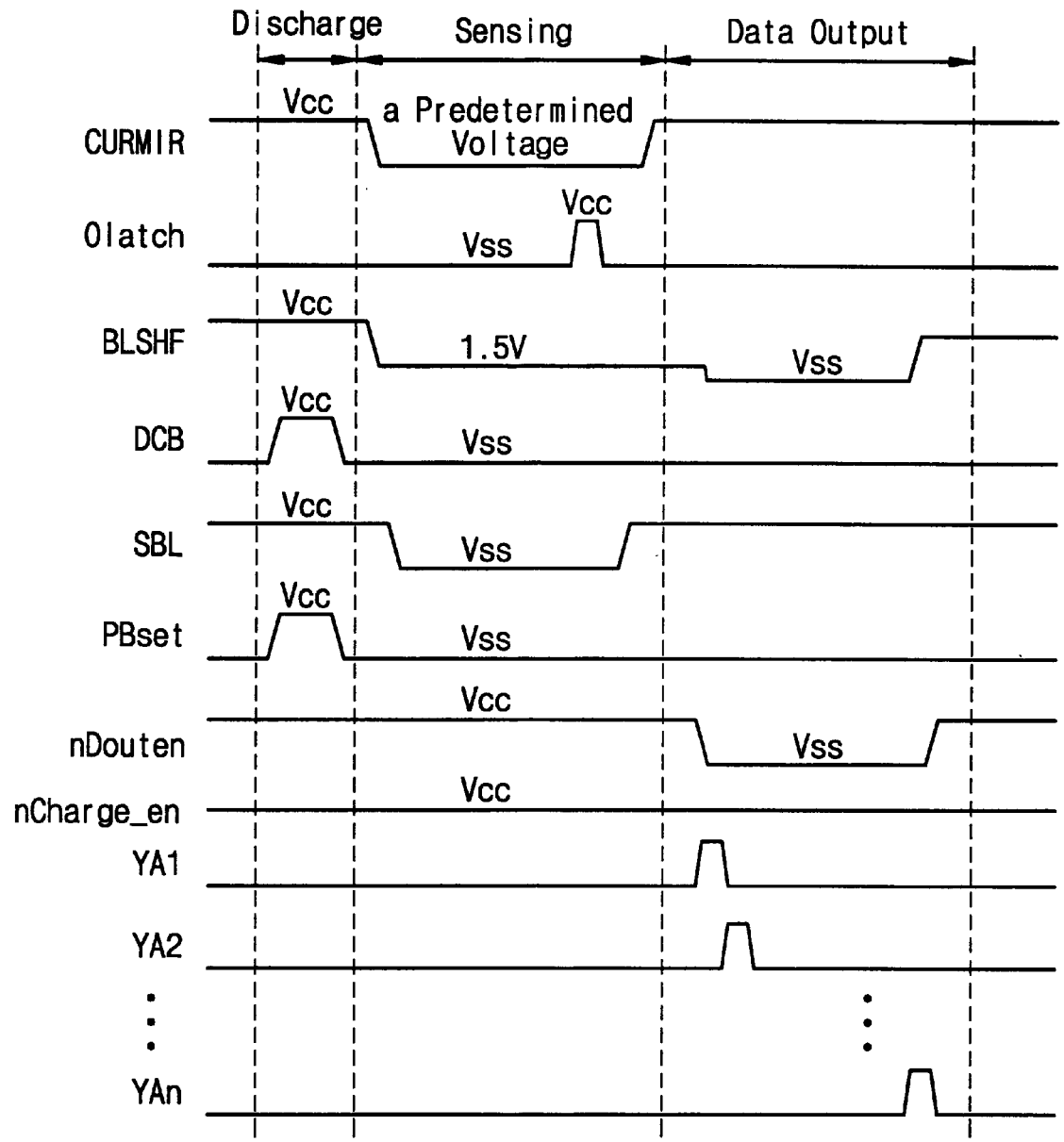
FIG. 5 is a timing diagram for describing a read operation according to the present invention.

FIG. 5 is a timing diagram for describing a read operation of NAND-type flash memory device using the page buffer according to the present invention. The read operation according to the present invention will be described more fully described below with reference to FIGS. 3 to 5. The page buffer 100_0, corresponding to the bit line BL0, is referred to in describing the read operation. Other page buffers 100_1 to 100_m, corresponding to other bit lines BL1 to BLm, have the same functions as those of the page buffer 100_0.

If the read operation is started, the signals BLSHF, CURMIR, DCB and SBL all are set to Vcc. This forces the transistors M21, M23 and M24 to be turned on and the transistor M22 to be turned off, thereby discharging the bit line BL0 to a ground voltage Vss level and the node N5 of the latch 120 to the ground voltage Vss level (that is, the latch 120 is reset). Since the signals PBset and nDouten are set to Vcc, the PMOS transistors M12 and M29 of FIG. 4 are turned off. This is to prevent power noise from being generated when the latch 120 is reset and the bit line BL0 is discharged. The above-described operation is referred to as "a discharge period of the read operation".

In this embodiment, as the signal nCharge_en is maintained at Vcc, the PMOS transistor M29 used as precharge means is turned off during the read operation. Therefore, the data bus DB may be charged at Vss during the read operation.

And then, in a sensing period of the read operation, data stored in a selected memory cell (e.g. a datum stored at WL0 and BL0) is sensed by the page buffer 100_0. In particular, the string selection line SSL, the ground selection line GSL and unselected word lines (e.g. WL1 to WLn) are set to Vcc or higher than Vcc while a selected word line (e.g. WL0) and common source line CSL are held to Vss. At this time, the voltage of the signal BLSHF goes to a predetermined voltage level, for example, about 1.5 to 1.6V, and the signals SBL and DCB transitions from a logic high level (e.g. Vcc) to a logic low level (e.g. Vss). The signal CURMIR drops down to a predetermined voltage level. With the biasing condition of the control signals, the bit line BL0 either is pulled up to about 1.5V when the selected memory cell MC0 is a programmed memory cell (referred to as an "off-cell"), or it is pulled down to 0V when the selected memory cell MC0 is an erased memory cell (referred to as an "on-cell").

In the case of the former, the sensing node N4 of the page buffer 100_0 becomes the power supply voltage Vcc level, so that when the signal Olatch goes high, the node N5 of the latch 120 is changed to Vcc from Vss by the NMOS transistors M25 and M26. In the case of the latter, the sensing node N4 thereof becomes the ground voltage Vss level, so that although the signal Olatch transitions from a logic low level to a logic high level, the node N5 of the latch 120 is held to Vss (since the transistor M25 is turned off).

During sensing data from the selected memory cell, the signal nDouten is set to Vcc and the signal PBset is set to Vss. Therefore, the latch 120 has the first current driving capacity which is determined only by the PMOS transistor M12.

Thereafter, in a data output period of the read operation, data held in the latch 120 is transferred to the data bus DB (i.e. its corresponding data line) from the page buffer 120 via the Y-pass gate circuit 30. During the data output period, the signal nDouten is set to the ground voltage Vss level, so that the PMOS transistor M29 of the latch 120 is turned on. This means that the current driving capacity of the latch 120 is increased by the current driving capacity of the transistor M29. Thus, the latch 120 has the second current driving capacity. Under this condition, when the Y-pass gate circuit 30 is activated, data in the latch 120 is transferred to the data bus DB which has been discharged at the voltage level of Vss. If the node N5 is held to Vcc, the data bus DB is charged up to the power supply voltage Vcc level by the PMOS transistors M12 and M29 of the latch 120. Since the transistors M12 and M29 supply the data bus DB with an amount of current sufficient to charge the data bus DB, the node N5 of the latch 120 continues to be maintained at the power supply voltage Vcc level without being discharged.

As seen from the above description, although the tri-state inverter INV3 is removed, the page buffer of the present invention performs the same read functions as those of FIG. 1. As a result, since only one transistor M29 and a signal line nDouten are added to the page buffer, while tri-state inverter INV3 is removed altogether, the chip region occupied by the page buffer of the invention is decreased to an important extent, compared with the conventional page buffer.

Figure 6:
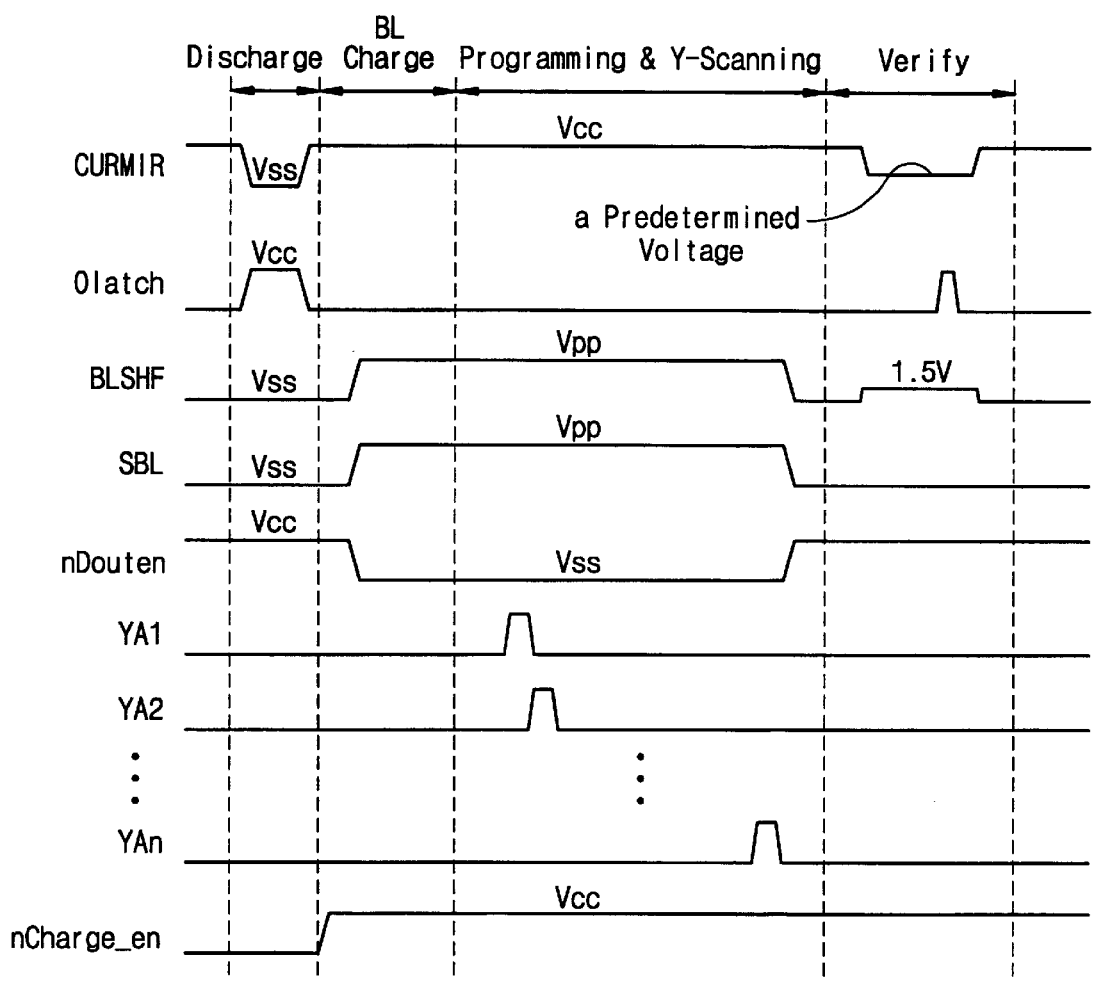
FIG. 6 is a timing diagram for describing a program operation according to the present invention.

FIG. 6 is a timing diagram for describing a program operation of the NAND-type flash memory device using the page buffer according to the present invention. The program operation will be more fully described below with reference to FIGS. 3, 4 and 6. The page buffer 100_0, corresponding to the bit line BL0, is referred to in describing the program operation. Other page buffers 100_1 to 100_m, corresponding to other bit lines BL1 to BLm, have the same functions as those of the page buffer 100_0.

In a discharge period of the program operation, the signals CURMIR, BLSHF and SBL are set to Vss, and the signal 0latch is set to Vcc. This forces the NMOS transistors M21 and M24 to be turned off and the PMOS transistors M22 and M28 and the NMOS transistor M26 to be turned on. Under this condition, as the sensing node N4 is pulled up to Vcc level by the transistor M22, the NMOS transistor M25 is turned on. Thus, the node N6 of the latch 120 is grounded via the transistors M25 and M26, so that the node N5 thereof is set to Vcc via the inverter INV21. At the same time, the signal nCharge_en is set to Vss level so as to charge the data bus DB at Vcc level. During the discharge period, the signal nDouten is set to Vcc level and the signal PBset is set to Vss level. That is, the current driving capacity of the latch 120 is determined only by the PMOS transistor M12 in FIG. 4.

Figure 2:
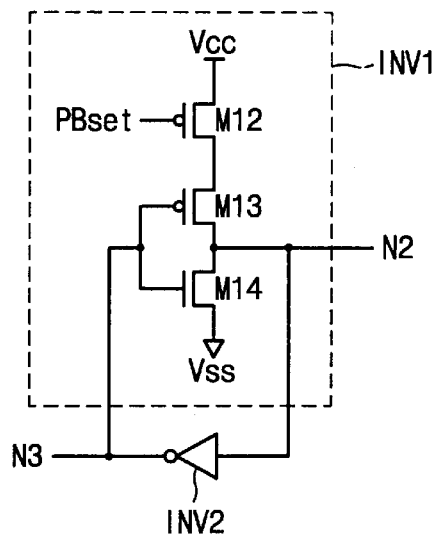
FIG. 2 is a detailed circuit diagram of a conventional latch illustrated in FIG. 1.

In a bit line charge period of the program operation, the node N5 of the latch 120 is reset to Vcc, and data to be programmed is loaded in the page buffer 100_0 via the Y-pass gate circuit 30. The signals BLSHF and SBL are set to Vpp higher than Vcc, and the signal nDouten is set to Vss. This forces the NMOS transistors M21 and M24 to be turned on, thereby charging the bit line BL0 either at Vcc (in this case, the selected memory cell is program inhibited) or at Vss (in this case, the selected memory cell is programmed) depending on a logic level of data to be programmed. Since the signal nDouten is set to Vss, the PMOS transistor M29 of the latch 120 is turned on, so that the current driving capacity of the latch 120 is determined by the PMOS transistors M12 and M29 (the latch 120 has the second current driving capacity). Thus, the bit line BL0 is charged more quickly in time via the NMOS transistors M21 and M24 as compared with the conventional page buffer which contains a latch having the current driving capacity determined only by one PMOS transistor M12 (refer to FIG. 2).

Continuously, after the bit line BL0 is charged either at Vcc or at Vss, a high voltage is applied to a selected word line (for example, WL0), so that a selected memory cell starts to be programmed for a predetermined time. At the same time with programming, Y-scanning operation is performed which is to check the programmed level of the memory cell so as to prevent the memory cell to be programmed from being over-programmed. As the NMOS transistor M8 of the Y-pass gate circuit 30 corresponding to the page buffer 100_0 is switched on, a latch state of the node N5 is transferred to the data bus DB via the Y-pass gate circuit 30. As illustrated in FIG. 6, since the signal nDouten is maintained at Vss during the programming and Y-scanning period, the current driving capacity of the latch 120 is determined by the sum of the current driving capacities of the PMOS transistors Ml12 and M29.

In the case where the data bus DB is discharged at Vss and the node N5 has Vcc (when the cell is program inhibited), charge sharing between the node N5 and the data bus DB occurs during the Y-scanning operation, so that the potential of the node N5 is increasingly lowered. This means that the memory cell to be inhibited is programmed. That is, the program disturb well known in the art can be induced. Therefore, in this embodiment, in order to prevent this disadvantage, the data bus DB is charged at Vcc by the PMOS transistor M28 before programming and Y-scanning. And then, a verify operation is performed. The verify operation is identical to data sensing of the above-described read operation, and description thereof is thus omitted.

As above described, the page buffer of the present invention performs the same program function as that of FIG. 1. As a result, since only one transistor M29 and a signal line nDouten are added to the page buffer, while the tri-state inverter is removed entirely, the region occupied by the page buffer of the invention can be decreased as compared with the conventional page buffer. Furthermore, during the bit line charge period of the program operation, the bit lines are charged more quickly in time via the NMOS transistors M21 and M24 of corresponding page buffers as compared with the conventional page buffer which contains a latch having the current driving capacity determined only by one PMOS transistor M12 of FIG. 2.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device comprising:
    a memory cell array of a plurality of memory cells arranged in word lines and bit lines;
    a plurality of page buffers, each page buffer having a latch for holding data, each of said latches including two or more separate current sources powered by a single fixed supply voltage, said current sources being selectively enabled to adjust the current drive capacity of said latches; and
    a switch circuit for selecting one or more of the bit lines to transfer data held in one or more of the latches corresponding to the selected bit lines to a data bus,
    wherein each of the latches in the respective page buffers has adjustable current driving capacity.

2. The memory device according to claim 1, wherein each of the latches has a first current driving capacity when data is sensed and latched by corresponding page buffers during a first phase of a read operation, and a second current driving capacity when data is transferred from the corresponding page buffers to the data bus via the switch circuit during a second phase of the read operation, the second current driving capacity being greater than the first current driving capacity.

3. The memory device according to claim 2, wherein each of the page buffers further comprises:
    a bit line shut-off transistor coupled between a sensing node and a corresponding bit line;
    a discharge transistor coupled between the sensing node and a ground voltage;
    a load transistor for supplying the corresponding bit line with load current in accordance with its gate voltage level; and
    a latch controller for controlling a latch state of data in a corresponding latch depending on a voltage level of the corresponding bit line;
    a first transfer transistor for transferring data in the corresponding latch to the corresponding bit line; and
    a second transfer transistor for transferring data in the corresponding latch to the data bus.

4. The memory device according to claim 3, wherein the latch of each page buffer comprises:
    an inverter having an input terminal coupled to a corresponding sensing node via the first transfer transistor and an output terminal coupled to the latch controller;
    a first pull-up transistor having a source coupled to a power supply voltage, a gate coupled to a first control signal, and a drain;
    a second pull-up transistor having a source coupled to the power supply voltage, a gate coupled to a second control signal, and a drain coupled to the drain of the first pull-up transistor;

a third pull-up transistor having a source coupled to a common drain of the first and second pull-up transistors, a gate coupled to the input terminal of the inverter, and a drain coupled to the output terminal of the inverter; and a pull-down transistor having a drain coupled to the input terminal of the inverter, a gate coupled to the output terminal of the inverter, and a source grounded.

5. The memory device according to claim 4, wherein current driving capacity of the second pull-up transistor is greater than that of the first pull-up transistor.

6. The memory device according to claim 4, wherein the first current driving capacity is determined by the first pull-up transistor, and the second current driving capacity is determined by the first and second pull-up transistors.

7. The memory device according to claim 6, wherein each of the latches has the first current driving capacity when data to be written to the memory cell array is latched in a corresponding page buffer during a first phase of a program operation, and has the second current driving capacity when data in the latches is transferred to the data bus via the switch circuit during a second phase of the program operation.

8. The memory device according to claim 4, wherein the first control signal is inactivated during a discharge period of the read operation.

9. The memory device according to claim 4, wherein the second control signal is activated when data in the latches is transferred to the data bus via the switch circuit during the read and the program operation, so that each of the latches has the second current driving capacity.

10. The memory device according to claim 4, wherein the second control signal is activated when data in the latches is transferred to corresponding bit lines during the program operation, so that each of the latches has the second current driving capacity.

11. The memory device according to claim 1, further comprising means for charging the data bus with a power supply voltage level before data in the latches is transferred to the data bus during a program operation.

12. A nonvolatile semiconductor memory device comprising:

a memory cell array of a plurality of memory cells arranged in word lines and bit lines;

a plurality of page buffers, each page buffer having a latch for holding data; and a switch circuit for selecting one or more of the bit lines to transfer data held in one or more of the latches corresponding to the selected bit lines to a data bus; and means for precharging the data bus with a defined voltage before a memory device program operation, wherein each of the latches in the respective page buffers has adjustable current driving capacity.

13. A nonvolatile semiconductor memory device comprising:

a memory cell array of a plurality of memory cells arranged in word lines and bit lines;

a plurality of page buffers, each page buffer having a latch for holding data, each of said latches including an operatively coupled pair of first and second transistors having separately controlled gates and common drains and common sources, the common sources of each of said pairs of first and second transistors being connected to a power supply voltage, the common drains of each of said pairs of first and second transistors providing a current summing node for selectively providing a first current drive capacity when only said first transistor is gated on and a second, greater current drive capacity when said first and second transistors are concurrently gated on; and a switch circuit for selecting one or more of the bit lines to transfer data held in one or more of the latches corresponding to the selected bit lines to a data bus, wherein each of the latches in the respective page buffers has adjustable current driving capacity.

* * * * *